(12) United States Patent
Schlasza et al.

(10) Patent No.: US 10,775,442 B2
(45) Date of Patent: Sep. 15, 2020

(54) DEVICE AND METHOD FOR DETERMINING A STORAGE CAPACITY OF AN ELECTRICAL ENERGY STORE

(71) Applicant: Robert Bosch GmbH, Stuttgart (DE)

(72) Inventors: Christian Schlasza, Esslingen (DE); Siegfried Lehmann, Ebersbach (DE)

(73) Assignee: Robert Bosch GmbH, Stuttgart (DE)

( * ) Notice: Subject to any disclaimer, the term of this patent is extended or adjusted under 35 U.S.C. 154(b) by 81 days.

(21) Appl. No.: 16/300,242

(22) PCT Filed: Mar. 17, 2017

(86) PCT No.: PCT/EP2017/056432
§ 371 (c)(1),
(2) Date: Nov. 9, 2018

(87) PCT Pub. No.: WO2017/198359
PCT Pub. Date: Nov. 23, 2017

(65) Prior Publication Data
US 2019/0154764 A1    May 23, 2019

(30) Foreign Application Priority Data

May 17, 2016   (DE) .................. 10 2016 208 422

(51) Int. Cl.
*G01N 27/416*   (2006.01)
*G01R 31/389*   (2019.01)
(Continued)

(52) U.S. Cl.
CPC ....... *G01R 31/389* (2019.01); *G01R 31/3842* (2019.01); *G01R 31/392* (2019.01);
(Continued)

(58) Field of Classification Search
CPC .............. G01R 31/389; G01R 31/3842; G01R 31/396; G01R 31/392; G01R 31/3679; G01R 31/36; G01R 31/3624
See application file for complete search history.

(56) References Cited

U.S. PATENT DOCUMENTS 4,743,855 A    5/1988  Randin et al.
6,114,838 A    9/2000  Brink et al.
(Continued)

FOREIGN PATENT DOCUMENTS

DE    102013103921 A1    11/2013
DE    102012224312 A1    6/2014
(Continued)

OTHER PUBLICATIONS

International Search Report dated May 22, 2017 of the corresponding International Application PCT/EP2017/056432 filed Mar. 17, 2017.

*Primary Examiner* — Thang X Le
(74) *Attorney, Agent, or Firm* — Norton Rose Fulbright US LLP; Gerard Messina

(57) ABSTRACT

A device and method for determining the storage capacity of an electrical energy store, as for example a rechargeable battery, based on the phase of the complex impedance of the electrical energy store. The impedance of the electrical energy store is determined in that the energy store is loaded with a specified periodic load and the system response setting in as a result is ascertained. On the basis of the correlation between the phase of the complex impedance of the electrical energy store and the storage capacity of the electrical energy store, it is thereupon possible reliably and in a simple manner to ascertain the storage capacity of the electrical energy store.

11 Claims, 2 Drawing Sheets

(51) Int. Cl.
*G01R 31/392* (2019.01)
*G01R 31/396* (2019.01)
*G01R 31/3842* (2019.01)
*H01M 10/48* (2006.01)

(52) U.S. Cl.
CPC ........ *G01R 31/396* (2019.01); *H01M 10/486* (2013.01); *H01M 2220/20* (2013.01)

(56) References Cited

U.S. PATENT DOCUMENTS

| | | | | |
|---|---|---|---|---|
| 6,313,609 | B1* | 11/2001 | Brink | G01R 31/389 320/132 |
| 8,378,688 | B2* | 2/2013 | Ohkura | G01R 31/389 324/430 |
| 8,635,038 | B2* | 1/2014 | Benjamin | G01R 19/16542 702/63 |
| 10,060,986 | B2* | 8/2018 | Imaizumi | G01R 31/3842 |
| 2003/0204328 | A1 | 10/2003 | Tinnemeyer | |
| 2005/0048336 | A1* | 3/2005 | Takebe | H01M 8/04223 429/413 |
| 2012/0019253 | A1 | 1/2012 | Ziegler et al. | |
| 2012/0123712 | A1 | 5/2012 | McHardy | |
| 2015/0226812 | A1 | 8/2015 | Gajewski et al. | |
| 2016/0084911 | A1* | 3/2016 | Mensah-Brown | G01N 29/024 |
| 2016/0238666 | A1* | 8/2016 | Kelly | G01R 31/392 |
| 2017/0331162 | A1* | 11/2017 | Clarke | H02J 7/0077 |

FOREIGN PATENT DOCUMENTS

| | | |
|---|---|---|
| EP | 2447728 | 5/2012 |
| GE | 102013218077 A1 | 3/2015 |
| JP | 2009244088 | 10/2009 |
| WO | WO-2012118005 A1 * | 9/2012 |

* cited by examiner

DEVICE AND METHOD FOR DETERMINING A STORAGE CAPACITY OF AN ELECTRICAL ENERGY STORE

FIELD OF THE INVENTION

The present invention relates to determining the storage capacity of an electrical energy store. The present invention in particular relates to a device and a method for determining the storage capacity of an electrical energy store such as a storage battery for example.

BACKGROUND INFORMATION

Patent document EP 2 447 728 A1 discusses a measuring system for a battery cell. The battery cell may be loaded with an impedance, it being possible to switch the load on or off via a switch that is operated in a clocked manner. A voltage drop across the impedance is low-pass filtered and subsequently evaluated.

Electrical energy stores such as lithium-ion batteries, for example, are used in numerous areas. They are used, for example, as traction batteries in electric vehicles. The storage capacity of the individual cells in such energy stores may vary over their service life. Checking the storage capacity is of great interest for evaluating the cells in such an energy store.

Currently, the cells of an energy store, such as lithium-ion battery cells for example, must be completely charged and discharged in order to obtain precise and reliable information about their storage capacity. Alternatively, it is also possible for data of an existing battery management system to provide information about the state and the storage capacity of the individual battery cells. For this purpose, however, the battery management system must be adjusted precisely to the individual cells of such an energy store.

SUMMARY OF THE INVENTION

The present invention discloses a device for determining a storage capacity of an electrical energy store having the features described herein and a method for determining the storage capacity of an electrical energy store having the features described herein.

Accordingly, the present invention provides:

A device for determining a storage capacity of an electrical energy store, comprising a loading device, a measuring device, a computing device and an evaluation device. The loading device is configured electrically to load the electrical energy store with a periodic load signal. The measuring device is configured to measure a system response of the electrical energy store to being loaded with the periodic load signal. The computing device is configured to ascertain a phase shift between the periodic load signal and the measured system response of the electrical energy store. The evaluation device is configured to determine the storage capacity of the electrical energy store by using the ascertained phase shift between the periodic load signal and the measured system response of the electrical energy store.

Furthermore, the present invention provides:

A method for determining a storage capacity of an electrical energy store comprising the steps: loading the electrical energy store with a periodic load signal; measuring a system response of the electrical energy store to being loaded with the periodic load signal; ascertaining a phase shift between the periodic load signal and the measured system response of the electrical energy store; and determining the storage capacity of the electrical energy store by using the ascertained phase shift between the periodic load signal and the measured system response of the electrical energy store.

The present invention is based on the recognition that determining the storage capacity of an electrical energy store, such as rechargeable batteries for example, is of great importance. In particular, the present invention is based on the recognition that already the sole analysis of a phase shift between the current and the voltage in an impedance measurement of an electrical energy store allows for reliable inferences regarding the storage capacity of the electrical energy store.

It is therefore an idea of the present invention to take this recognition into account and to provide a device and a method, which allow for determining the storage capacity of the electrical energy store on the basis of a phase shift in an electrical impedance measurement of the electrical energy store. An impedance measurement of the electrical energy store for determining a phase shift between current and voltage may be implemented by a very low and brief load placed on the electrical energy store. This allows for a particularly quick and gentle determination of the storage capacity of the electrical energy store.

In order to measure the impedance of the electrical energy store, the electrical energy store must be loaded with a defined load. In particular, it is possible to load the electrical energy store with a specified current amplitude for example. In particular, a periodic load at a specified frequency is required for measuring impedance. For measuring impedance in accordance with the present invention, particularly frequencies of more than one Hertz, in particular between one Hertz and ten or fifteen Hertz are sufficient. In this manner, it is possible to determine the storage capacity relatively quickly within a few seconds. As an alternative to loading the electrical energy store with a predefined current characteristic, it is also possible to measure the electrical current at a specified voltage characteristic.

For the purpose of measuring impedance, it is possible for example to obtain a sinusoidal signal when the electrical energy store is loaded periodically. Due to the electrochemical properties of the battery, a quasi-steady state system response will set in already after just a few periods. Subsequently, an impedance measurement and in particular a determination of the phase shift between the set load and the quasi-stationary system response that is setting in, that is, for example between current and voltage.

From the phase of the impedance of the electrical energy store thus ascertained it is then possible to infer the storage capacity of the electrical energy store. For example, the phase of the impedance of the electrical energy store may be compared to a previously ascertained function or a previously ascertained characteristic curve in order to determine the current storage capacity of the electrical energy store. The characteristic curves or functions for the correlation between the phase of the impedance and the storage capacity of the electrical energy store may be ascertained for example beforehand by practical measurements or theoretical simulation.

According to one specific embodiment, the evaluation device comprises a memory that is configured to store a previously ascertained correlation between phase shift and storage capacity of the electrical energy store. The evaluation device may be configured to determine the storage capacity of the electrical energy store on the basis of the correlations stored in the memory between phase shift and storage capacity. The correlation between phase shift and storage capacity may be defined as a function between phase shift and storage capacity. Alternatively, it is also possible to store a table, for example a look-up table, in the memory of the evaluation device, which for various phase shifts respectively defines a corresponding storage capacity of the electrical energy store. In particular, an interpolation between different values stored in the memory of the evaluation device is also possible. It is also possible to store a correlation between the storage capacity and phase shift as well as one or several additional parameters of the electrical energy store in the memory of the evaluation device. For this purpose, various functions or multiple tables may be stored for the additional parameters of the electrical energy store. Alternatively, a multidimensional function or a multidimensional characteristics field is also possible, which is stored in the memory of the evaluation device.

According to another specific embodiment, the loading device is configured to load the electrical energy store with a periodic load signal, the frequency of the periodic load signal being between one and fifteen Hertz, in particular between one and ten Hertz. Load signals are possible in a one-digit or two-digit Hertz range, that is, between one Hertz and approximately 100 Hertz. Periodic load signals having a frequency in this range, in particular a frequency of only a few Hertz, are particularly well suited for measuring the impedance of the electrical energy store for determining the storage capacity.

According to one specific embodiment, the frequency of the periodic load signal is adaptable. It is thus possible to adapt the determination of the storage capacity of the electrical energy store flexibly to different system or boundary conditions.

According to another specific embodiment, the evaluation device is configured to determine the storage capacity of the electrical energy store by using additional parameters of the electrical energy store. In particular, it is possible for the evaluation device to determine the storage capacity of the electrical energy store by using a temperature of the electrical energy store, a current state of charge of the electrical energy store, an identifier or type designation of the electrical energy store and/or at least one further parameter of the electrical energy store. In this manner, it is possible to adapt the determination of the storage capacity of the electrical energy store to additional further boundary conditions.

According to one specific embodiment, the device for determining the storage capacity of the electrical energy store comprises a detector device. This detector device is configured to determine a temperature of the electrical energy store. In this manner, it is possible to include the current temperature of the electrical energy store when determining the storage capacity of the electrical energy store. Alternatively, it is also possible for the temperature of the electrical energy store and possibly also additional parameters of the electrical energy store to be provided by another device such as for example a battery management system or the like.

According to another specific embodiment, the detector device is configured to determine the temperature of the electrical energy store based on loading the electrical energy store with another periodic load signal and evaluating the system response of the electrical energy store to the application of the additional load signal to the electrical energy store. The frequency of the additional periodic load signal is in this instance greater than the frequency of the periodic load signal that is applied to the electrical energy store for determining the storage capacity. In this manner, it is also possible for the temperature of the electrical energy store to be determined on the basis of an impedance measurement of the electrical energy store. Thus it is possible to use common components for determining the temperature and for determining the storage capacity of the electrical energy store. By using different frequencies for determining the temperature and for determining the storage capacity, it is possible to decouple the two measurements.

According to another specific embodiment, the loading device loads the electrical energy store with a predetermined current signal. The measurement device is configured to measure a resulting voltage characteristic as the system response. Alternatively, it is also possible to load the electrical energy store with a predetermined voltage characteristic and to evaluate the current characteristic that sets in in the process. In both cases, however, the electrical energy store is loaded at least until a quasi-steady state system response to the loading of the electrical energy store sets in. For the subsequent determination of the storage capacity of the electrical energy store, the phase shift between current and voltage in the quasi-steady state is evaluated.

According to one specific embodiment of the method for determining the storage capacity of the electrical energy store, the step for determining the storage capacity determines the storage capacity of the electrical energy store by using a characteristic curve of previously ascertained correlations between phase shift and storage capacity. If additional parameters are taken into account for determining the storage capacity of the electrical energy store, such as for example the temperature of the electrical energy store, the state of charge of the electrical energy store or possibly other parameters, then the step for determining the storage capacity of the electrical energy store is able to ascertain the storage capacity either based on a multidimensional characteristics field or alternatively is able to select from a plurality of specified characteristic curves the specific characteristic curve that best corresponds to the additional parameters of the electrical energy store.

According to one specific embodiment, the method further comprises the step for classifying the electrical energy store based on the previously determined storage capacity. The classification of the energy store may be comprise for example a subdivision into two states such as "good" and "bad" or a classification into "functional" and "faulty". The classification may be performed by comparing the ascertained storage capacity of the electrical energy store to a specified limit value. Furthermore, a detailed classification into more than two states is also possible.

For this purpose, the ascertained storage capacity of the electrical energy store may occur with multiple different graduated limit values. The subdivision into multiple classes may be as finely graduated as desired.

For example, three, four, five, eight, ten or any other number of classes are possible for classifying the electrical energy store.

The above embodiments and developments may be combined with one another as desired if this is practical. Further embodiments, developments and implementations of the present invention also comprise combinations, not explicitly mentioned, of features of the present invention described above or below with reference to the exemplary embodiments. In particular, one skilled in the art will also add individual aspects as improvements or supplements to the respective basic forms of the present invention.

The present invention is explained in more detail below with reference to the exemplary embodiments indicated in the schematic figures of the drawings.

Unless indicated otherwise, in all figures, identical or functionally equivalent elements and devices have been provided with the same reference symbols.

DETAILED DESCRIPTION

Electrical energy stores in the sense of the present invention are all types of energy stores that are configured to store electrical energy over a period of time and to provide the stored energy again when needed in electrical form. Electrical energy stores comprise in particular rechargeable batteries such as accumulators, for example lithium-ion batteries, nickel metal hydride accumulators (NiMH), or any other accumulators. The present invention may be applied both to individual cells of such energy stores as well as to modules or battery packs having a plurality of such cells.

Figure 1:
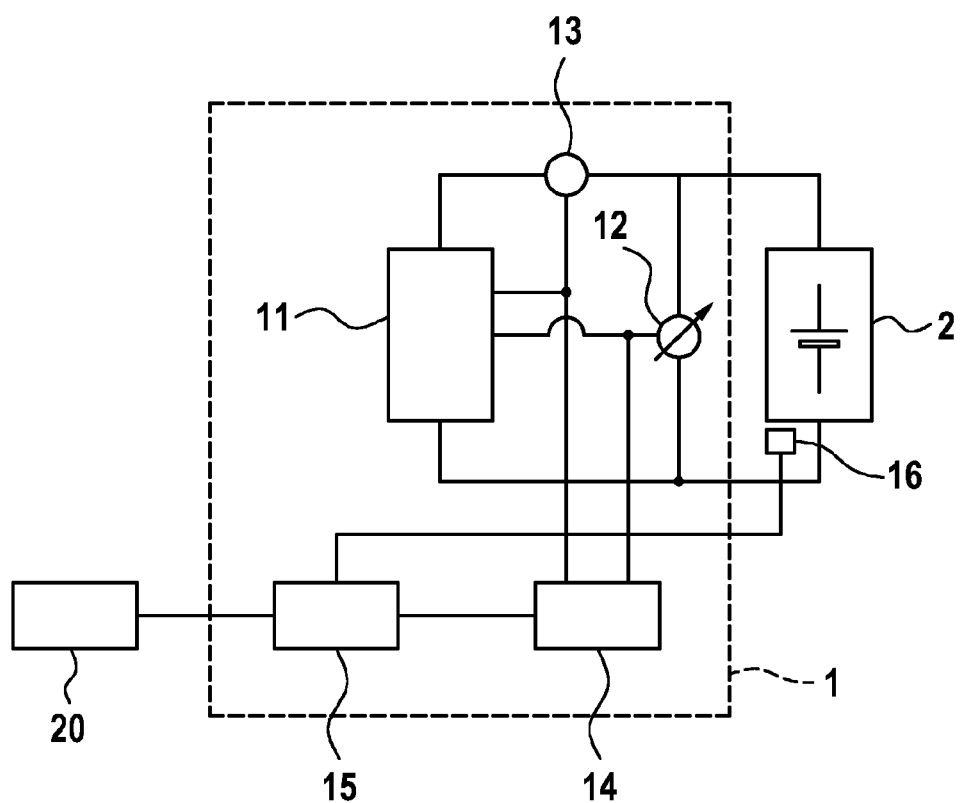
FIG. 1 shows a schematic representation of a device for determining the storage capacity of an electrical energy store according to one specific embodiment.

FIG. 1 shows a schematic representation of a device 1 for determining a storage capacity of an electrical energy store 2 according to one specific embodiment. Device 1 for determining the storage capacity of electrical energy store 2 comprises a loading device 11, a measuring device, in particular a voltage measuring device 12 and/or a current measuring device 13, a computing device 14 and an evaluation device 15. Furthermore, device 1 for determining the storage capacity of electrical energy store 2 may additionally comprise one or multiple sensors such as for example a detector device 16 for measuring the temperature of electrical energy store 2. Device 1 for determining the storage capacity may furthermore be coupled with additional components such as a battery management system 20 for example.

For ascertaining the storage capacity of electrical energy store 2, electrical energy store 2 is initially loaded with an excitation signal. This loading of electrical energy store 2 is performed by loading device 11 that is electrically connected to electrical energy store 2. Electrical energy store 2 may be loaded, for example, by a specified electrical current flowing through electrical energy store 2. Alternatively, electrical energy store 2 may also be loaded by a specified electrical voltage. Loading device 11 loads the electrical energy store 2 with a periodic load signal at a specified frequency. The frequency of the periodic loading signal may be in the range of a few Hertz. The frequency of the periodic load signal may be for example in a single digit or double digit Hertz range, that is, between one and 100 Hertz. In particular, the frequency of the periodic load signal may be in the range between one and fifteen or between one and ten Hertz. Thus, for example, load signals having a frequency of one, two, five Hertz or the like are possible. The frequency of the periodic load signal may be fixed by loading device 11. Alternatively, it is also conceivable to adapt the frequency of the periodic load signal. For example, the frequency of the periodic load signal in the previously described frequency range may be adapted as a function of additional system parameters such as temperature, state of charge, type of electrical energy store 2 or any other parameters, for example.

After electrical energy store 2 has been loaded by loading device 11 with a periodic load signal, a corresponding system response will set in. Thus, for example, when loading electrical energy store 2 with a specified current, that is, with a specified amplitude of the current, with which electrical energy store 2 is loaded, a corresponding periodic voltage characteristic will set in. Alternatively, when loading electrical energy store 2 with a specified voltage characteristic, a resulting current characteristic will set in in response. In the process, normally, after a few periods of the periodic load signal, a quasi-steady state will set in as a system response to the load. For the purpose of monitoring the current characteristic, it is possible to provide a current sensor 13 between loading device 11 and electrical energy store 2, which measures the current flowing from electrical energy store 2 into loading device 11. For the purpose of monitoring the voltage characteristic, it is furthermore possible to provide a voltage sensor 12 on the clamps of electrical energy store 2 or on the terminals of loading device 11, which measures the voltage characteristic at the respective position. The current sensor and voltage sensor may be any current or voltage sensor that is able to detect the current or the voltage in the specified value range and to provide a corresponding output signal in response. In particular, the provided output signal may include both an analog as well as a digital output signal. The output signals of voltage sensor 12 and/or of current sensor 13 may be provided on loading device 11 so that loading device 11 is able to regulate the loading of electrical energy store 2 in accordance with the measuring results. Furthermore, it is also possible to provide the output signals of voltage sensor 12 and of current sensor 13 on computing device 14. Computing device 14 evaluates the characteristic of the electrical current that was detected by current sensor 13 and of the electrical voltage that was detected by voltage sensor 12 and in the process calculates a phase difference between the detected electrical current and the detected electrical voltage, that is, a phase difference between the electrical load produced by loading device 11 and the system response setting in as a result. In addition, it is optionally also possible for computing device 14 to detect and evaluate the amplitudes of current and voltage and to calculate from these the impedance of electrical energy store 2 completely. This complex impedance of electrical energy store 2 may possibly be provided by computing device 14 for further evaluations. The absolute value of this impedance, however, is not essential for determining the storage capacity of electrical energy store 2, as it is described below. Rather, the storage capacity of electrical energy store 2 may be determined exclusively on the basis of the phase difference between current and voltage, that is, the phase of the impedance of electrical energy store 2. If indicated, however, it is also possible to include the absolute value of the ascertained impedance entirely or partially in the determination of the storage capacity. Even if in the following the determination of the storage capacity of electrical energy store 2 is described only with reference to the ascertained phase of the impedance of electrical energy store 2, taking the absolute value of the impedance into account is thereby not to be excluded. In particular, it is possible to determine the storage capacity of the electrical energy store also when using the completely ascertained impedance of electrical energy store 2.

The phase difference between current and voltage, that is, between loading and system response of electrical energy store 2, calculated by computing device 14, is subsequently provided to evaluation device 15. Evaluation device 15 is thereupon able to determine the storage capacity of electrical energy store 2 on the basis of the phase difference between current and voltage on electrical energy store 2. For this purpose, evaluation device 15 compares the ascertained phase difference between current and voltage to a previously ascertained correlation between the storage capacity of electrical energy store 2 and the corresponding phase difference and from the comparison of the current phase difference with the correlation stored in evaluation device 15 determines a value for the current storage capacity of electrical energy store 2.

For example, evaluation device 15 may comprise a memory, in which a characteristic curve or a characteristics field is stored for the correspondence between phase difference and storage capacity of electrical energy store 2. This correlation between phase difference and storage capacity may be stored for example in the form of a one-dimensional or multi-dimensional function. Alternatively, it is also possible for the correlation between storage capacity and phase difference as well as possibly other parameters to be stored in the form of one or multiple tables in the memory of evaluation device 15. This correlation between storage capacity and phase difference as well as possibly additional parameters may in particular have been previously ascertained by measurement on real equivalent energy stores. Alternatively, it is also conceivable to ascertain the correlation between storage capacity and phase difference and possibly additional parameters by calculation on the basis of simulations. It is also possible that only few interpolation points are stored in the memory of evaluation device 15 as concrete values. In this case, to determine the storage capacity of electrical energy store 2, evaluation device 15 is able to perform an interpolation based on these interpolation points in order to determine the storage capacity of electrical energy store 2 as precisely as possible. For this purpose, it is possible for example to determine a linear, quadratic or higher function on the basis of the stored interpolation point values.

To increase the accuracy of the storage capacity to be ascertained of electrical energy store 2, it is possible for evaluation device 15 to take into account additional parameters of electrical energy store 2 when determining the storage capacity. For example, it is possible to include the temperature of electrical energy store 2 in determining the storage capacity. For this purpose, it is possible to ascertain the temperature of electrical energy store 2 prior to determining the storage capacity. For example, it is possible to ascertain the temperature of electrical energy store 2 using a temperature sensor 16 situated on electrical energy store 2. Alternatively, it is also possible, however, to ascertain the temperature of electrical energy store 2 likewise on the basis of the phase of the complex impedance of electrical energy store 2. For this purpose, it is possible to load electrical energy store 2 with another load signal. This load may be applied analogously to the load that is applied for determining the storage capacity of electrical energy store 2, for example likewise by loading device 11. Loading electrical energy store 2 for the purpose of determining the temperature differs from loading it for the purpose of determining the storage capacity in that for determining the temperature a periodic load signal is applied to energy store 2 whose frequency is higher than the frequency of the load signal for determining the storage capacity of electrical energy store 2.

The frequency of the load signal for determining the temperature may be in the range of several ten Hertz or possibly in the range of more than one hundred Hertz, for example. Subsequently, it is possible to determine the current temperature of electrical energy store 2 by evaluating the phase difference between the load signal and the system response setting in as a result in the quasi-steady state based on a previously ascertained correlation between the phase difference and the temperature.

Furthermore, it is also possible to include additional parameters for determining the storage capacity of electrical energy store 2 such as, for example, the state of charge of the electrical energy store, the type or the identification of the electrical energy store or any additional parameters. In this case, it is possible to store in evaluation device 15 the dependency of the storage capacity on the additional parameters that are to be taken into account likewise in the form of a multi-dimensional function or a multi-dimensional characteristics field. Based on the thus stored correlation between storage capacity and the ascertained parameters of the electrical energy store, it is possible for evaluation device 15 to ascertain the current storage capacity of the electrical energy store. In particular, it is possible for this purpose to connect evaluation device 15 to a battery management system 20 or any additional components, as needed, in order to obtain from battery management system 20 or the additional components the required information regarding the additional parameters to be taken into account.

Likewise, evaluation device 15 is able to forward the ascertained storage capacity of electrical energy store 2 to battery management system 20 or to any another component, as needed. Based on the ascertained storage capacity of electrical energy store 2, it is possible thereupon to output a warning when a specified minimum storage capacity of electrical energy store 2 is undershot. Alternatively, it is also possible to store the characteristic of the ascertained storage capacity of electrical energy store 2 in a memory of battery management system 20 or any additional memory and read it out if needed at a later time for service purposes or the like. Other evaluations of the ascertained storage capacity of electrical energy store 2 are furthermore also possible, as needed.

Figure 2:
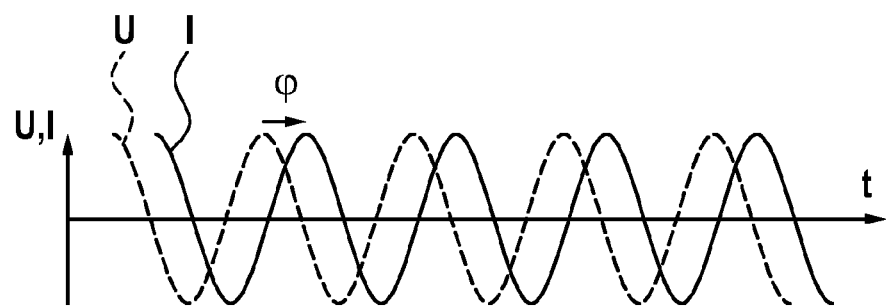
FIG. 2 shows a schematic representation of a signal characteristic between the loading and the system response for measuring the impedance according to one specific embodiment.

FIG. 2 shows a schematic representation of the characteristic of current U and voltage I, as these may occur when determining the storage capacity of electrical energy store 2 using device 10 for determining the storage capacity. As may be seen here, in the quasi-steady state following the loading of electrical energy store 2 with a specified load signal, a current characteristic I will set in, which has a constant phase difference $\varphi$ with respect to voltage characteristic U. This phase difference $\varphi$ is determined by computing device 14 and subsequently serves in evaluation device 15 to determine the current storage capacity of electrical energy store 2.

Apart from the sinusoidal characteristic shown here for the periodic load signal, other periodic load signals, in particular rectangular, trapezoidal, triangular or any other load signals are also conceivable.

Figure 3:
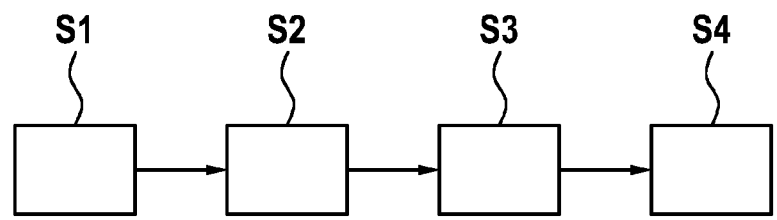
FIG. 3 shows a schematic representation of a flow chart for a method for determining the storage capacity of an electrical energy store, on which one specific embodiment is based.

FIG. 3 shows a schematic representation of a flow chart, which is at the basis one specific embodiment of a method for determining a storage capacity of an electrical energy store 2. In step S1, electrical energy store 2 is loaded with a periodic load signal. The load signal may be a load at a specified current characteristic and alternatively at a specified voltage characteristic. In step S2, the system response of electrical energy store 2 to the loading with the periodic load signal is measured and subsequently, in step S3, a phase difference is ascertained between the periodic load signal and the measured system response of electrical energy store 2. The ascertainment of the phase shift between load signal and system response occurs only when a quasi-steady state system response to the periodic loading of electrical energy store 2 has set in.

In step S4, the storage capacity of electrical energy store 2 is finally determined. The storage capacity of electrical energy store 2 is determined based on the ascertained phase shift between load signal and measured system response of the electrical energy store, as this was already explained in detail above. In particular, for determining the storage capacity of the electrical energy store, it is possible to use a characteristic curve or a characteristics field for the correlation between storage capacity and phase shift as well as possibly additional parameters of electrical energy store 2.

Based on the ascertained storage capacity of electrical energy store 2, it is possible to classify the state of electrical energy store 2. For this purpose, it is possible for example to compare the ascertained storage capacity of electrical energy store 2 to a specified limit value. If the ascertained storage capacity exceeds the specified limit value, then electrical energy store 2 may be classified as "good" or "intact". If the ascertained storage capacity of electrical energy store 2 falls below the specified limit value, then electrical energy store 2 may be classified as "bad" or "faulty". Aside from a classification of electrical energy store 2 into merely two classes, a classification into more than two classes is also possible. Thus it is possible for example to specify several limit values and thereby to produce a finer graduation of the classification of electrical energy store 2 into multiple classes. For example, a classification may be performed in three, four, five, eight, ten or any other number of classes.

The specified limit value or the specified limit values may be specified in a fixed manner, for example. In particular, type-dependent or configuration-dependent limit values for the respective electrical energy store 2 are also possible. Furthermore, it is also possible to adapt the limit value or the limit values for the classification of electrical energy store 2.

In summary, the present invention relates to the determination of the storage capacity of an electrical energy store such as for example a rechargeable battery, in particular a traction battery of an electric vehicle, based on the phase of the complex impedance of the electrical energy store. For this purpose, the impedance of the electrical energy store is determined in that the energy store is loaded with a specified periodic load and the system response setting in as a result is determined. On the basis of the correlation between the phase of the complex impedance of the electrical energy store and the storage capacity of the electrical energy store, it is thereupon possible reliably to ascertain the storage capacity of the electrical energy store in a simple manner.

What is claimed is:

1. A device for determining a storage capacity of an electrical energy store, comprising:
   a loading device to load the electrical energy store with a periodic load signal;
   a measuring device to measure a system response of the electrical energy store to the loading with the periodic load signal;
   a computing device to ascertain a phase shift between the periodic load signal and the measured system response of the electrical energy store; and
   an evaluation device to determine the storage capacity of the electrical energy store by using the ascertained phase shift between the periodic load signal and the measured system response of the electrical energy store,
   wherein a temperature of the electrical energy store is ascertained to determine the storage capacity, wherein the temperature is ascertained based on the phase of the impedance of the electrical energy store.

2. The device of claim 1, wherein the evaluation device includes a memory to store a previously ascertained correlation between phase shift and storage capacity of the electrical energy store, and wherein the evaluation device determines the storage capacity of the electrical energy store based on the correlation between phase shift and storage capacity stored in the memory.

3. The device of claim 1, wherein the loading device is configured to load the electrical energy store with a periodic load signal that has a frequency between one and ten Hertz.

4. The device of claim 1, wherein the frequency of the periodic load signal is adaptable.

5. The device of claim 1, wherein the evaluation device is further configured to determine the storage capacity of the electrical energy store by using a temperature of the electrical energy store, a state of charge of the electrical energy store, an identifier of the electrical energy store and/or at least one further parameter of the electrical energy store.

6. The device of claim 5, further comprising:
   a detector device to determine a temperature of the electrical energy store.

7. A device for determining a storage capacity of an electrical energy store, comprising:
   a loading device to load the electrical energy store with a periodic load signal;
   a measuring device to measure a system response of the electrical energy store to the loading with the periodic load signal;
   a computing device to ascertain a phase shift between the periodic load signal and the measured system response of the electrical energy store;
   an evaluation device to determine the storage capacity of the electrical energy store by using the ascertained phase shift between the periodic load signal and the measured system response of the electrical energy store; and
   a detector device to determine a temperature of the electrical energy store,
   wherein the evaluation device is further configured to determine the storage capacity of the electrical energy store by using a temperature of the electrical energy store, a state of charge of the electrical energy store, an identifier of the electrical energy store and/or at least one further parameter of the electrical energy store,
   wherein the detector device is configured to determine the temperature of the electrical energy store based on loading the electrical energy store with a further periodic load signal and evaluating a system response of the electrical energy store to the loading of the electrical energy store with the additional load signal, the frequency of the additional periodic load signal being greater than the frequency of the periodic load signal with which the electrical energy store is loaded for determining the storage capacity of the electrical energy store.

8. The device of claim 1, wherein the loading device loads the electrical energy store with a predetermined current signal, and the measuring device measures a resulting voltage characteristic as the system response.

9. A method for determining a storage capacity of an electrical energy store, the method comprising:
loading the electrical energy store with a periodic load signal;
measuring a system response of the electrical energy store to the loading with the periodic load signal;
ascertaining a phase shift between the periodic load signal and the measured system response of the electrical energy store; and
determining the storage capacity of the electrical energy store by using the ascertained phase shift between the periodic load signal and the measured system response of the electrical energy store,
wherein a temperature of the electrical energy store is ascertained to determine the storage capacity, wherein the temperature is ascertained based on the phase of the impedance of the electrical energy store.

10. The method of claim 9, wherein the storage capacity of the electrical energy store is determined by using a characteristic curve of previously ascertained correlations between phase shift and storage capacity.

11. The method claim 9, further comprising:
classifying the electrical energy store based on the determined storage capacity.

* * * * *